United States Patent [19]
McCoy et al.

[11] Patent Number: 5,741,614
[45] Date of Patent: Apr. 21, 1998

[54] ATOMIC FORCE MICROSCOPE MEASUREMENT PROCESS FOR DENSE PHOTORESIST PATTERNS

[75] Inventors: John H. McCoy, San Carlos; Kyoichi Suwa, San Mateo, both of Calif.

[73] Assignee: Nikon Corporation, Japan

[21] Appl. No.: 543,424

[22] Filed: Oct. 16, 1995

[51] Int. Cl.⁶ .................................................... G03C 5/00
[52] U.S. Cl. ........................... 430/30; 430/312; 430/313; 430/323
[58] Field of Search ........................ 430/30, 311, 312, 430/313, 323

[56] References Cited

U.S. PATENT DOCUMENTS

| | | | |
|---|---|---|---|
| 4,968,585 | 11/1990 | Albrecht et al. | 430/323 |
| 5,420,796 | 5/1995 | Weling et al. | 437/8 |
| 5,569,399 | 10/1996 | Penney et al. | 437/173 |

OTHER PUBLICATIONS

D. Nyyssonen, et al., "Two–dimensional atomic force microprobe trench metrology system", J. Vac. Sci. Technol. B9(6), Nov./Dec. 1991, pp. 3612–3616.

*Primary Examiner*—Christopher G. Young
*Attorney, Agent, or Firm*—Skjerven, Morrill, MacPherson, Franklin & Friel; Norman R. Klivans

[57] ABSTRACT

Accurate measurement of the sidewalls of photoresist features formed on a semiconductor substrate is achieved by a double mask exposure process. This allows probing the sidewalls of closely spaced photoresist features with the probe tip of an atomic force microscope, in spite of the small (submicron) physical dimensions involved. First a conventional line/space pattern is exposed onto the photoresist using the desired mask. Then a second exposure is made using a second mask which has a special space pattern to effectively remove the already exposed photoresist features along at least one side of one of the previously exposed features. Hence, at least that one side of that one feature is clear of any adjoining photoresist features when the photoresist is then developed after the two exposures. This allows easy access to the sidewall of that one photoresist feature by tilting the probe tip of the atomic force microscope. This allows the measurement of the photoresist feature sidewall characteristics, including for instance angle, curvature and any artifacts present.

22 Claims, 5 Drawing Sheets

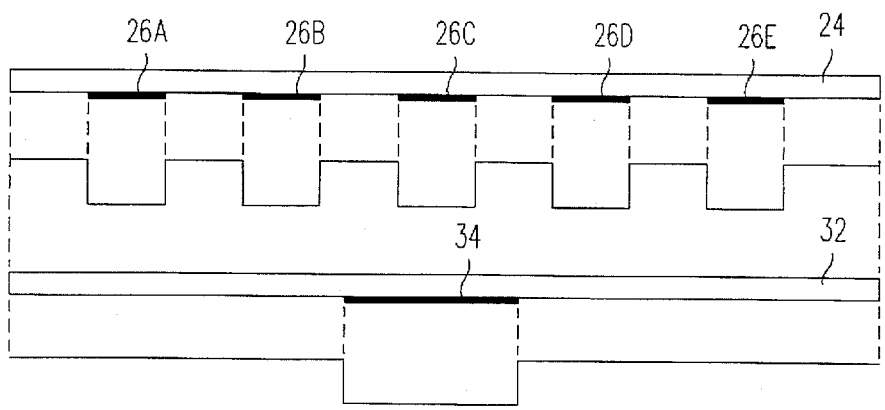
FIG. 3A
FIG. 3B
FIG. 3C
FIG. 3D
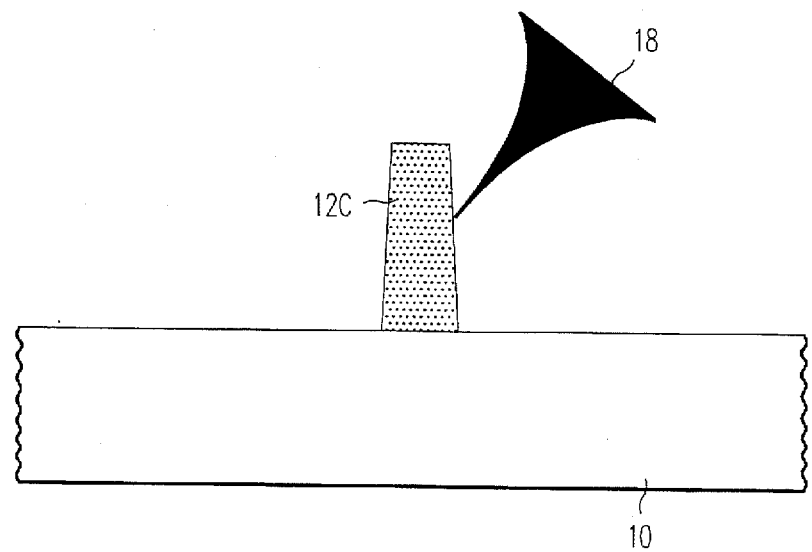
FIG. 4

ATOMIC FORCE MICROSCOPE MEASUREMENT PROCESS FOR DENSE PHOTORESIST PATTERNS

BACKGROUND OF THE INVENTION

1. Field of the Invention

This invention pertains to semiconductor device and integrated circuit fabrication and more specifically to a method for probing photoresist patterns and other integrated circuit features for test purposes using an atomic force microscope.

2. Description of the Prior Art

As is well known, fabrication of integrated circuits typically involves forming a layer of photoresist over an underlying layer (substrate) of e.g. silicon, oxide, metal or other material. The photoresist layer is then exposed to actinic (exposing) radiation through a mask (reticle). The mask includes opaque and transparent portions defining a pattern. An image of the pattern on the mask is thus transferred to the photoresist which is then developed in order to define the same pattern in the photoresist. If the photoresist is a positive type photoresist, the portions of the photoresist which are exposed to the radiation, after being developed, are removed, hence leaving the underlying portions of the substrate exposed for a subsequent etching step. In contrast, the developed positive photoresist remains over the nonexposed portions. Hence a subsequent etching step will define the mask pattern in the underlying substrate as defined by the mask image in the photoresist.

It is a well known problem that dense (submicron) feature patterns have different properties than more widely spaced (larger geometry) features in the photoresist. Such a dense pattern is referred to herein as a dense line/space structure, i.e. a fine dimensioned feature.

Photoresist patterns are used to characterize the performance of optical exposure systems, especially the projection lens. These exposure systems are used to form the above-described features on integrated circuits. Test patterns such as a dense line/space structure allow the performance to be measured in a standard way.

In the prior art for test purposes, to make sure that the photolithographic process is working as desired, it is therefore necessary to examine the sidewalls of the photoresist features after exposure and development for angle, curvature and any undesirable artifacts present. One prior art approach is to form the photoresist layer, expose it through the mask, develop the photoresist and then physically slice the photoresist and the underlying wafer to form a cross section which can be examined by a scanning electron microscope. This is very time consuming and costly and of course destroys the wafer.

An alternative is to make "top down" measurements, without slicing, using a scanning electron microscope or an optical microscope. However, this does not give much useful information about the feature sidewalls, since this method does not allow access to the sidewalls.

Special probe tips have been proposed for atomic force microscopy for probing features on integrated circuit wafers. See "Two Dimensional Atomic Force Microprobe Trench Methodology System" by D. Nyyssonen et al., J. Vac. Sci. Technol. B 9(6), Nov/Dec 1991 pp. 3612–3616. This publication discloses use of either a very thin probe or a "dumbbell" tip on the probe. Such special tips are difficult to make, and more importantly are inherently limited in use by their size; probing very small critical dimensions requires making an even small size tip.

Hence it would be very desirable to have a method for accurately measuring the properties of sidewalls of a submicron geometry integrated circuit feature that is not limited by probe tip size and without destructive testing.

SUMMARY

In accordance with the invention, an atomic force microscope (or other type of scanning probe microscope) is used to probe the sidewalls of photoresist (or other) integrated circuit features. Since typically the tip of the atomic force microscope probe cannot penetrate the narrow space between dense line/space structures, in accordance with the invention an adjacent photoresist feature is in effect removed during the photoresist exposure process. This is accomplished by using a second exposure of a special "space pattern" to expose and then remove (during the development process) the adjacent photoresist feature exposed by the first mask pattern. Removal of the adjacent photoresist feature allows sufficient room for the probe tip of the atomic force microscope to contact the photoresist feature sidewall. Applications are to characterize the image transferring quality or the image projecting performance of both step and repeat and scanning exposure photolithography systems.

BRIEF DESCRIPTION OF THE DRAWINGS

FIGS. 3A through 3D show double exposure masking in accordance with the present invention.

FIG. 4 shows a resultant single photoresist feature after the processing of FIGS. 3A through 3D.

DETAILED DESCRIPTION OF THE PREFERRED EMBODIMENTS

Figure 1:
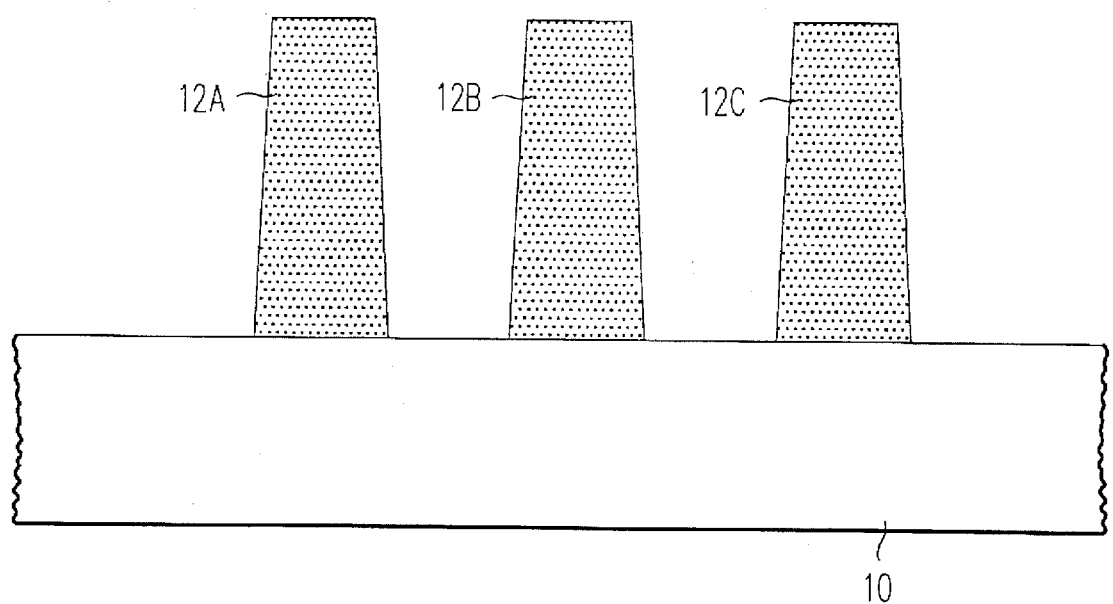
FIG. 1 shows in cross section a prior art substrate with several photoresist features formed thereon.

FIG. 1 shows a (simplified) cross-sectional view of a typical semiconductor substrate structure 10, which is typically a silicon substrate or a silicon substrate having formed thereon an oxide layer and/or metallization layers. Structures 12A, 12B and 12C are each a photoresist feature shown in cross-section and closely spaced apart, each intended conventionally to define a structure in the underlying substrate 10 by means of a subsequent etching step.

Figure 2:
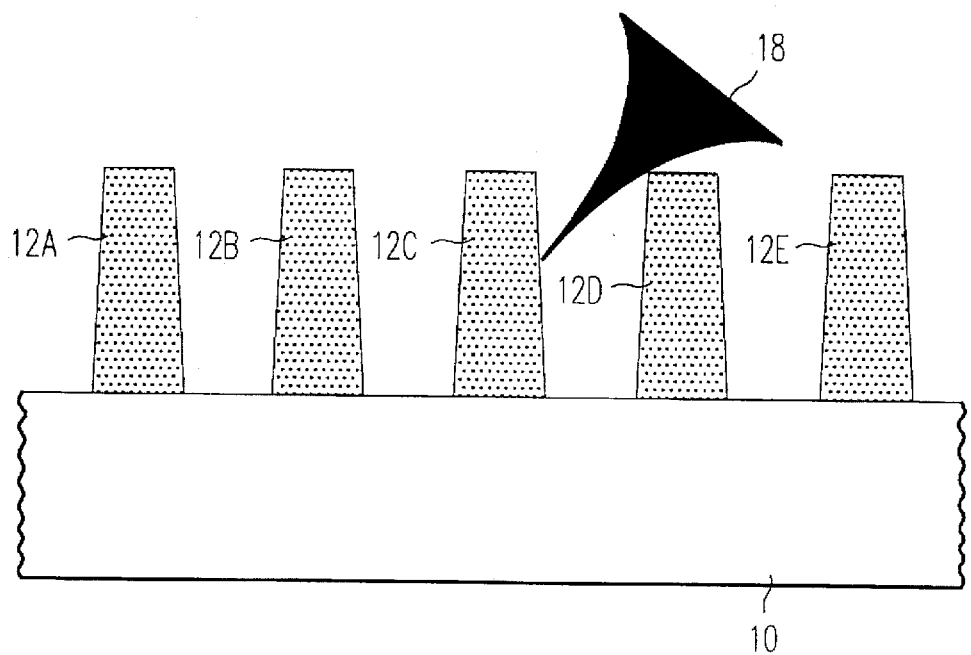
FIG. 2 shows a substrate with several photoresist features formed thereon in an attempt to probe a sidewall of one of the features with an AFM probe.

FIG. 2 shows similar substrate 10 with in this case five photoresist features 12A, 12B, 12C, 12D and 12E formed thereon. It is to be understood that these photoresist features are shown after a positive photoresist is exposed using a mask and then developed, and the portions of the photoresist which are not exposed are removed during the developing stage. Also shown in simplified form is a narrow diameter probe tip 18 of an atomic force microscope (AFM). The probe tip 18 is of the needle type shown by Nyyssonen et al.

"Scanning probe microscope" (SPM) means an instrument which provides a microscopic analysis of the topographical features or other characteristics of a surface by causing a probe to scan the surface. It refers to a class of instruments which employ a technique of mapping the spatial distribution of a surface property, by localizing the influence of the property to a small probe. The probe moves relative to the sample and measures the change in the property or follows constant contours of the property. Depending on the type of SPM, the probe either contacts or rides slightly (up to a few hundred Angstroms) above the surface to be analyzed. Scanning probe microscopes include devices such as atomic force microscopes (AFMs), scanning tunneling microscopes (STMs), scanning acoustic microscopes, scanning capacitance microscopes, magnetic force microscopes, scanning thermal microscopes, scanning optical microscopes, and scanning ion-conductive microscopes.

"Probe" means the element of an AFM which rides on or over the surface of the sample and acts as the sensing point for surface interactions. In an AFM the probe includes a flexible cantilever and a microscopic tip which projects from an end of the cantilever. In an STM the probe includes a sharp metallic tip which is capable of sustaining a tunneling current with the surface of the sample. This current can be measured and maintained by means of sensitive actuators and amplifying electronics. In a combined AFM/STM the probe includes a cantilever and tip which are conductive, and the cantilever deflection and the tunneling current are measured simultaneously.

"Atomic Force Microscope" (also referred to as a Scanning Force Microscope) means an SPM which senses the topography of a surface by detecting the deflection of a cantilever as the sample is scanned. An AFM may operate in a contacting mode, in which the tip of the probe is in contact with the sample surface, or a noncontacting mode, in which the tip is maintained at a spacing of about 50 Å or greater above the sample surface. The cantilever deflects in response to electrostatic, magnetic, van der Waals or other forces between the tip and surface. In these cases, the deflection of the cantilever from which the tip projects is measured.

Scanning probe microscopes (SPMs) are used to obtain extremely detailed analyses of the topographical or other features of a surface, with sensitivities extending down to the scale of individual atoms and molecules. Several components are common to practically all scanning probe microscopes. The essential component of the microscope is a tiny probe positioned in very close proximity to a sample surface and providing a measurement of its topography or some other physical parameter, with a resolution that is determined primarily by the shape of the tip and its proximity to the surface. In an atomic force microscope (AFM), the probe includes a tip which projects from the end of a cantilever. Typically, the tip is very sharp to achieve maximum lateral resolution by confining the force interaction to the end of the tip. A deflection sensor detects the deflection of the cantilever and generates a deflection signal, which is then compared with a desired or reference deflection signal. The reference signal is then subtracted from the deflection signal to obtain an error signal, which is delivered to a controller.

Atomic force microscopes therefore are used typically for measuring surface properties of microscopic structures. The probe tips are very small but do have a significant length. It is to be understood that the remaining portion of the AFM probe other than the tip is not shown in FIG. 2, but extends to the upper right in the drawing. As shown in FIG. 2, the relatively long probe tip is not able to reach down all the way to the surface of substrate 10 between closely spaced photoresist features 12C and 12D. Hence it is impossible to measure the properties of the sidewall of feature 12C adjacent the substrate 10 and also impossible to measure the properties of the surface of substrate 10 between photoresist features 12C and 12D. Therefore FIG. 2 illustrates the problem in using an atomic force microscope to measure properties of the sidewalls of photoresist features where photoresist features are closely spaced apart (dense) as in submicron photolithography. Note that FIG. 2 depicts the tilting of the tip of the atomic force microscope probe; however even at maximum tilt the probe cannot reach down far enough to fully access the sidewalls of for instance photoresist feature 12C.

It can be seen that even an elongated narrow diameter probe having a dumbbell tip as disclosed by Nyyssonen et al. must be narrow enough to physically fit between adjacent photoresist features 12C and 12D. This limitation prohibits use with very closely spaced features.

In accordance with the invention, the problem depicted in FIG. 2 is solved by use of an extra mask step in exposing the photoresist. The photoresist is exposed using a first mask which defines closely spaced lines and spaces (e.g., a test pattern) or an actual integrated circuit mask. Then, prior to developing the photoresist, a second "space" mask pattern is used to further expose the photoresist in order to expose a "space" that in effect removes the adjacent photoresist features when the photoresist is developed.

This double exposure process is illustrated in FIGS. 3A through 3D. FIG. 3A illustrates (in a side view) the first conventional test pattern mask which includes a transparent substrate 24 on which are formed five opaque masking regions 26A, 26B, 26C, 26D and 26E. When radiation is passed through this mask, it forms areas of light intensity as illustrated correspondingly in FIG. 3B having areas of low light intensity and high light intensity. It is to be understood that in this embodiment the photoresist is a positive photoresist so when the photoresist is developed, the areas of photoresist which have been exposed to the exposure light are removed and only the nonexposed photoresist areas remain.

FIG. 3C shows the second "space" mask pattern in accordance with the present invention which includes transparent substrate 32 on which is formed, in this case, a single opaque region 34. The corresponding high and low intensity light levels are shown in FIG. 3D. When light is passed through this second mask, it defines a single area of nonexposed photoresist with adjacent exposed areas. That is, a latent image of the opaque region (line pattern) of the first mask remains in the photoresist layer. The net result after the photoresist is developed is shown in FIG. 4 in which only a single photoresist feature 12C remains, which corresponds to the area of low exposure defined by both opaque area 26C on the first mask of FIG. 3A and by the opaque area 34 on the second mask of FIG. 3C. There are no photoresist features on either side of photoresist feature 12C after the photoresist is developed. Hence probe 18 can easily contact the entire sidewall of feature 12C right down to the substrate, and also contact the substrate 10 adjacent to the feature 12C with no clearance problems. In this particular case both sidewalls of feature 12C are easily accessible to the probe 18. It is to be understood that if one wanted only to probe a single sidewall of feature 12C, one could leave intact the adjacent features, for instance 12A or 12B or 12E, and 12D of FIG. 2.

The present method can be carried out even by large size (inexpensive) probe tips, or can be carried out using the needle type or dumbbell probe tips if desired. Advantageously, the standard large size tips are satisfactory.

Analysis by the present inventors has indicated that the two exposures as shown in FIGS. 3A through 3D do in fact produce the desired result. That is, the exposures in effect add linearly given the use of positive photoresist. This is because the two exposures allow in effect three levels of exposure, not just the two of the typical binary single mask. This process is effective with conventional photoresist at least down to a spacing (feature size) between adjacent photoresist features of 0.3 µm.

Figure 5:
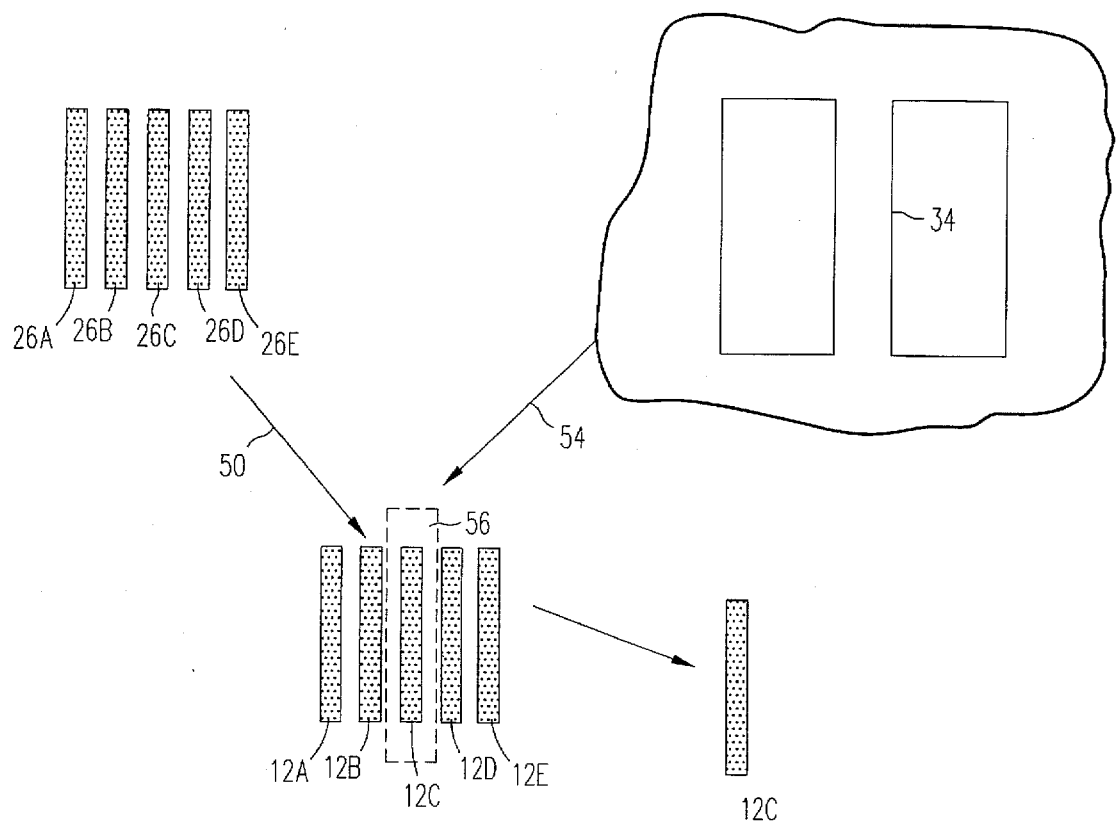
FIG. 5 shows a plan view of the double exposure masking process of FIGS. 3A to 3D.

FIG. 5 depicts the process of FIGS. 3A through 3D in a top (plan) view. The upper left hand portion of FIG. 5 shows the patterns (opaque areas) 26A through 26E of the mask of FIG. 3A. These mask patterns 26A to 26E are used, for instance, for checking resolution value, distortion, and focus of the projection exposure apparatus. (The transparent substrate portion of the mask is not shown for simplicity.) As indicated by arrow 50 which shows the process flow, the first exposure of the photoresist using this mask results in the exposure of areas 12A through 12E (first latent images) of the photoresist as shown in the central portion of FIG. 5. Then as indicated by arrow 54 showing the next step in the process, a second opaque area 34 on a second mask (or on a second portion of the first mask if so desired) is used to expose the photoresist a second time to define the area indicated by the dotted line 56 (second latent image).

Then the twice-exposed photoresist layer is developed (chemically etched) as shown by arrow 60 to provide the resulting isolated photoresist feature 12C only. As can be seen, the second exposure using opaque area 34 in effect eliminates features 12A, 12B and 12D, 12E from the developed photoresist. Hence both sidewalls of feature 12C are now clear by a predetermined distance and the probe of the atomic force microscope can easily access these sidewalls. Note that by making opaque area 34 larger, for example features 12A and 12B would be preserved and in this case it would not be possible to access the lefthand sidewall of feature 12C.

Mask region 34 may be located on the same mask (reticle) as mask regions 26A through 26E and a simple programmed translation of the wafer (substrate) brings this new opaque mask region 34 over the desired area of the photoresist. Reticle blinds in the stepper can be set to select only this pattern and the wafer moved to the proper position by the interferometry controlled xy movable stage which is conventionally provided. This somewhat simplifies the process by not requiring the use of an additional physical mask and associated alignment step. It is to be understood that the line/space arrangement to be produced may not be that of an actual semiconductor device but may be a special test pattern.

Note that even with the embodiment of FIGS. 4 and 5, the scanning tip of the atomic force microscope must be tilted in order to access the sides of the photoresist features. The mechanism to accomplish this tilting is a standard part of general purpose AFM's, e.g. the commercially available Park Scientific Autoprobe or the Veeco Dektak SXM.

Figure 6A:
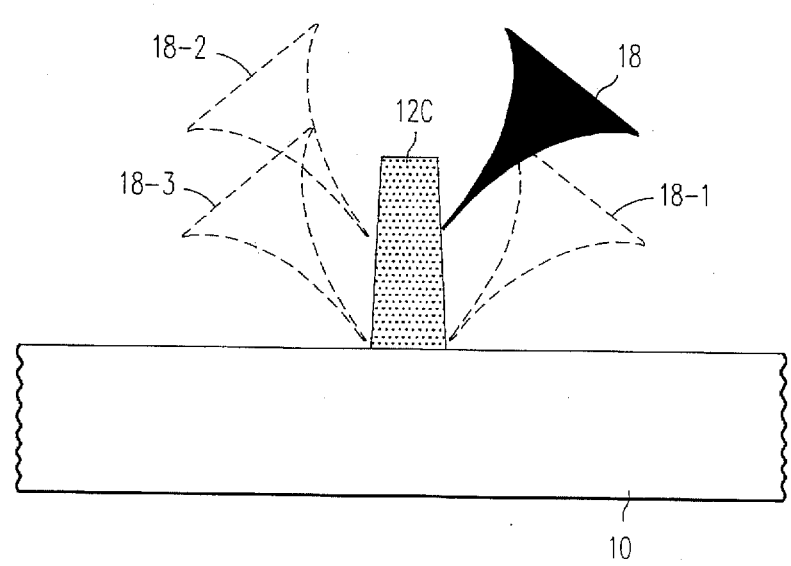
FIG. 6A shows probing an isolated photoresist feature in accordance with the present invention.
Figure 6B:
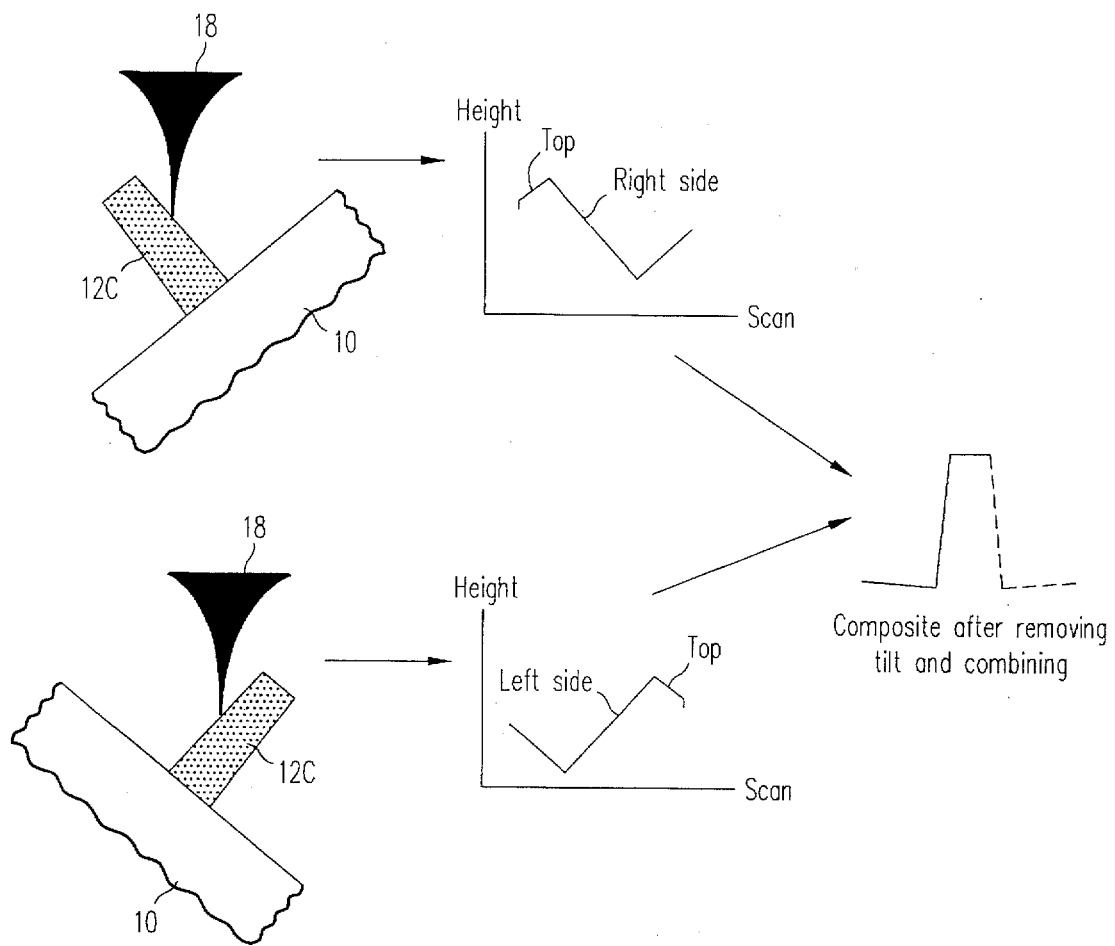
FIG. 6B shows calibrating tilt and use of measurements using the technique of FIG. 6A.

The actual translation of the measurements used when probing feature 12C using probe 18 in FIG. 4 may be carried out by a variety of well known methods. One method is illustrated in FIGS. 6A and 6B. As shown in FIG. 6A, the photoresist feature 12C is probed by probe 18 which is shown in several other different scan positions 18-1, 18-2, and 18-3 indicated by the dotted lines. The following describes one procedure to calibrate the tilt of probe 18 and to relate the measurements on each sidewall of resist structure 12C. This is not limiting but is illustrative of one such process. The tilt angle is usually calibrated mechanically by the AFM or it can be deduced from a known pitch that is measured while foreshortened by the tilt angle. A procedure for associating the left and right tilt scans as taken in FIG. 6A is shown in FIG. 6B. The upper portion of FIG. 6B shows the tilt scan for the righthand sidewall of feature 12C and the lower portion of FIG. 6B shows the tilt scan for the left sidewall of feature 12C.

In the upper portion of FIG. 6B, the top of the feature 12C is common to both scans and is used to associate the left scan to the right scan after factoring out the tilt angle. The actual scan in terms of height relative to scan direction is shown in the line graph in the center portion of FIG. 6B. These scans are then associated to form a composite as shown in the right hand portion of FIG. 6B, after removing the tilt factors in order to form a scan of the entire photoresist feature 12C. Other matching procedures as known in the art for scanning both sides of naturally isolated features could also be used.

Figure 7:
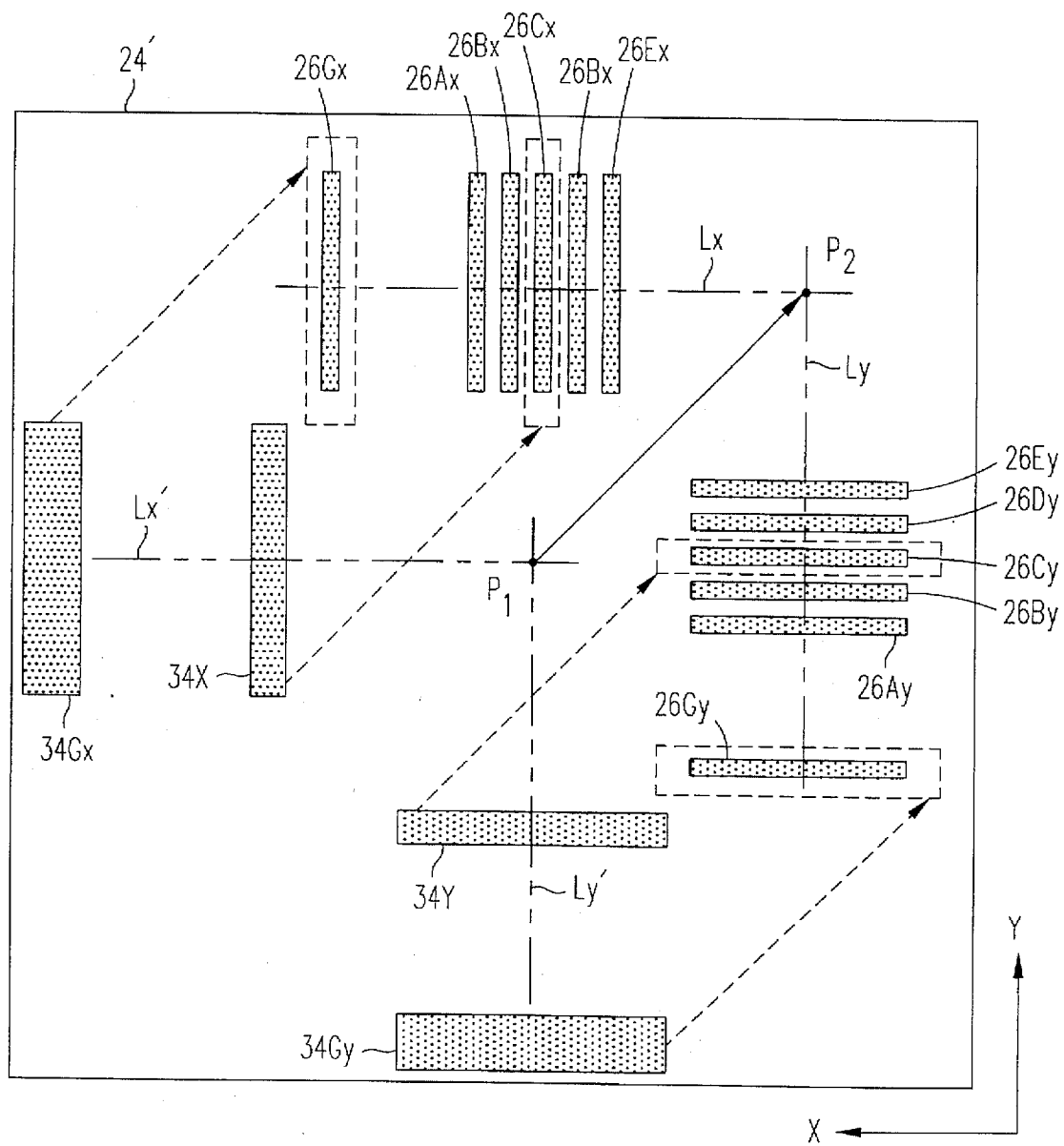

FIG. 7 illustrates for another embodiment in accordance with the present invention a pattern formed on a part of a test reticle for determining transferring performance (such as resolution, distortion, and focus accuracy) of an exposure apparatus (e.g. projection aligner, x-line aligner, or mask projection type electron beam aligner). Here, each of line and space patterns 26Ax to 26Ex in the x direction and line and space patterns 26Ay to 26Ey in the y direction, which are to be used in the first exposure, and patterns 34x, 34y, 34Gx, and 34Gy, which are to be used in the second exposure, are formed as a shielding (opaque) area on one mask substrate.

Line Lx' (parallel to the x axis) and line Ly' (parallel to the y axis) lie orthogonal to each other with a point P1 as their intersection. Point P1 is approximately in the center of a pattern forming area 24'. Lines Lx' and Ly' together are shifted along a diagonal line at 450 to corresponding point P2 where lines Lx and Ly are placed. Line Lx is the center line of line and space patterns 26Ax to 26Ex, and line Ly is the center line of line and space patterns 26Ay to 26Ey. In the first exposure where an exposure apparatus is used, after each pattern in the pattern forming area 24' is transferred onto a resist layer of the substrate 10 and a latent image is thereby formed, the mask and substrate 10 are shifted relative to each other in both the x and y directions so that point P1 and point P2 are overlaid. Then, after the second exposure, an image of the shielding pattern 34x is overlaid on the line pattern 26Cx which is the center of the line and space patterns 26Ax to 26Ex, and an image of the shielding pattern 34y is overlaid on the line pattern 26Cy which is the center of the line and space patterns 26Ay to 26Ey. Therefore, after the resist layer development, resist features that correspond only to line patterns 26Cx and 26Cy remain on the substrate 10.

Furthermore in this embodiment, in the pattern forming area 24', there are isolated line pattern 26Gx and isolated line pattern 26Gy, which have almost the same width as line and space patterns 26Ay to 26Ey. Latent images that were formed in the resist layer corresponding to each of these isolated line patterns 26Gx and 26Gy are shielded and protected by respectively patterns 34Gx and 34Gy in the pattern forming area 24' during the second exposure. Pattern forming area 24' has an area of about 100 square micrometers on the mask and is arranged in the x and y directions having a uniform space (e.g., about 1 cm) between repetitions of area 24'.

Figure 8:
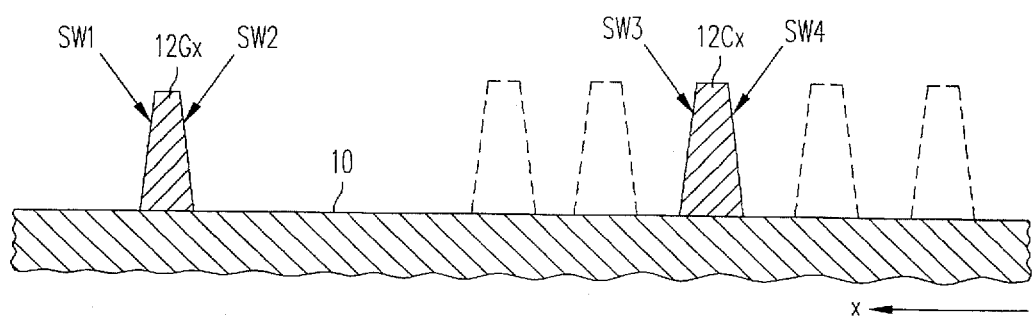
FIGS. 7 and 8 show for a second embodiment in accordance with the present invention respectively a test reticle and a resulting photoresist pattern.

A resist feature as shown in FIG. 8 can be obtained when the resist layer on substrate 10 is developed after the first and second exposures. FIG. 8 shows a cross section of the resist layer corresponding to the position of line Lx in FIG. 7. Resist feature 12Cx corresponding to line pattern 26Cx (which is the center of line and space patterns 26Ax to 26Ex) and resist feature 12Gx corresponding to the isolated line pattern 26Gx will remain on the surface of the substrate 10.

Even though as shown resist features 12Cx and 12Gx have the same line width on the mask, they could have a slightly different line width, or have a different gradient or "sagging" of each of their sidewalls SW1, SW2, SW3, and SW4. This is because a line pattern in an original line and space pattern that has a periodic structure and an original line pattern that is isolated transfer in different ways due to their differences in receiving the irradiation characteristics of exposure energy used by the exposure apparatus (due to factors such as angle distribution of the exposure radiation, its coherency, and its monochromaticity) and due to optical characteristics of various projection optical systems (e.g. OTF, MTF, aperture NA and others). Therefore, by measuring and comparing surface profiles of resist features 12Cx and 12Gx with an AFM probe, the image transferring performance of the exposure apparatus can be determined and irradiation conditions of the illumination optical system and its optical characteristics (NA, and others) can also be optimized. Furthermore it should be clear that resist features 12Cx and 12Gx are adequately separated on the substrate 10 so as not to contact the AFM probe.

While the preferred embodiment of this disclosure is directed to probing photoresist features, the present double exposure method is easily used for probing other features (i.e. mesas in silicon, or metal or oxide features) which are formed by an etching step using a photoresist layer. In this case, after development of the photoresist the underlying material is etched and the remaining photoresist is stripped. A sidewall of the underlying feature material is thus rendered accessible by the double exposure for SPM probing.

Also, the double exposure process can be done in reverse, with the special space mask being used for the first exposure and the conventional mask being used for the second exposure.

This disclosure is illustrative and not limiting; further modifications will be apparent to one skilled in the art and are intended to fall within the scope of the appended claims.

We claim:

1. A method of measuring a feature formed on a substrate, the feature being one of a number of such features on the substrate, comprising the steps of:
   forming a photoresist layer on the substrate;
   exposing the photoresist layer to radiation through a first mask pattern which defines a plurality of features;
   exposing the photoresist layer to radiation through a second mask pattern, the second mask pattern allowing irradiation of portions of the photoresist layer also irradiated through the first mask pattern;
   then developing the photoresist layer, wherein the developed photoresist layer defines at least one particular feature defined by the first exposing step, and the particular feature having no other features within a predetermined distance of one side thereof as defined by the second exposing step; and
   contacting the one side of the particular feature with a scanning microscope probe.

2. The method of claim 1, wherein the second step of exposing isolates the one particular feature, whereby there is no other feature within a predetermined distance of either side thereof.

3. The method of claim 1, further comprising the step of tilting the probe relative to a plane defined by a surface of the substrate prior to the step of contacting.

4. The method of claim 1, wherein the photoresist is a positive-type photoresist.

5. The method of claim 1, wherein in the first step of exposing, at least two of the plurality of features lie within 0.5 µm of each other.

6. The method of claim 1, wherein the second mask pattern is formed on a same reticle as the first mask pattern.

7. The method of claim 1, wherein the second mask pattern defines at least a single unexposed region of the photoresist layer.

8. The method of claim 1, wherein the probe is a needle-type probe.

9. The method of claim 1, wherein the probe has a dumbbell-shaped tip.

10. The method of claim 2, further comprising the steps of:
    contacting both sides of the particular feature with the scanning microscope probe; and
    combining measurements taken from the steps of contacting to form an image of the particular feature.

11. The method of claim 1, further comprising the step of:
    after the step of developing, etching the substrate, thereby defining at least the one particular feature in the substrate.

12. A method for measuring a surface profile of a portion of a resist layer formed on a substrate, comprising the steps of:
    forming latent images of line and space patterns in the resist layer by an exposure apparatus, the line patterns being capable of remaining and the space patterns being capable of being removed from the resist layer after development of the resist layer;
    erasing at least one latent image of the line patterns, so as to leave remaining a particular latent image corresponding to at least one of the line patterns;
    developing the particular latent image in the resist layer and thereby forming a patterned feature of the resist layer corresponding to the particular latent image; and
    measuring a surface profile of the patterned feature by contacting a sidewall of the patterned feature with a scanning microscope probe.

13. A method comprising the steps of:
    forming an image of a line and space pattern having a selected pitch in a layer coated on a substrate by exposing the layer using an exposure apparatus, the line and space pattern having a plurality of line patterns effecting to remain in the layer and a plurality of space patterns effecting to be removed from the layer;
    removing at least one image of one of the line patterns adjacent to a specific line pattern image formed in the layer, whereby a specific line pattern feature is formed in the layer; and
    measuring a surface profile of the specific line pattern feature of the layer by contacting at least one side surface of the specific line pattern feature with a scanning microscope probe.

14. The method of claim 13, wherein the layer is a resist layer coated on the substrate to a predetermined thickness.

15. The method of claim 14, wherein the forming step includes a first exposing step to form a latent image of the line and space pattern within the resist layer.

16. The method of claim 15, wherein the removing step includes a second exposing step to erase a latent image of the at least one or more line pattern adjacent to the specific line pattern image, and a developing step to form the specific line pattern feature according to the specific line pattern.

17. The method of claim 16, wherein the exposure apparatus includes a projection optical system having a resolution performance so as to image a line pattern having a width less than about 0.3 micrometer.

18. A method for measuring a surface profile of a pattern formed in a lithography process, comprising the steps of:

forming an image of a periodic pattern having a selected pitch on a surface of a substrate through a projection system of a lithographic exposure apparatus, the periodic pattern having a plurality of first patterns to remain on the substrate surface and a plurality of second patterns to be removed from the substrate surface;

removing at least one image of one of the first patterns adjacent to a particular first pattern image formed on the substrate surface, whereby a particular first pattern feature is formed on the substrate in an isolated state; and measuring a surface profile of the particular first pattern feature by contacting at least one side surface of the particular first pattern feature with a scanning microscope probe.

19. The method of claim 18, further comprising the step of determining an image transferring performance of the projection system of the lithographic exposure apparatus on the basis of surface profile information obtained in the measuring step.

20. The method of claim 19, wherein the forming step is performed by projecting an image of said periodic pattern formed on a reticle through the projection system.

21. The method of claim 20, wherein the measuring step further comprises the step of relatively tilting the substrate surface and the scanning microscope probe.

22. The method of claim 20, wherein the substrate is coated with a photoresist layer on its surface, and the removing step includes developing the photoresist layer.

* * * * *